United States Patent
Goodin

(10) Patent No.: US 7,279,263 B2
(45) Date of Patent: Oct. 9, 2007

(54) DUAL-WAVELENGTH POSITIVE-WORKING RADIATION-SENSITIVE ELEMENTS

(75) Inventor: Jonathan W. Goodin, Tyler, TX (US)

(73) Assignee: Kodak Graphic Communications Canada Company, Burnaby, British Columbia (CA)

( * ) Notice: Subject to any disclaimer, the term of this patent is extended or adjusted under 35 U.S.C. 154(b) by 0 days.

(21) Appl. No.: 11/157,204

(22) Filed: Jun. 20, 2005

(65) Prior Publication Data

US 2005/0287468 A1 Dec. 29, 2005

Related U.S. Application Data

(60) Provisional application No. 60/582,085, filed on Jun. 24, 2004.

(51) Int. Cl.
*G03F 7/021* (2006.01)
*G03F 7/023* (2006.01)
*G03F 7/30* (2006.01)

(52) U.S. Cl. .................. 430/157; 430/176; 430/191; 430/192; 430/193; 430/302

(58) Field of Classification Search ............... 430/191, 430/192, 193, 270.1, 326, 157, 176, 302
See application file for complete search history.

(56) References Cited

U.S. PATENT DOCUMENTS

| | | | | |
|---|---|---|---|---|
| 5,219,699 | A | * | 6/1993 | Walls et al. ............... 430/156 |
| 5,262,270 | A | * | 11/1993 | Walls ...................... 430/156 |
| 5,316,892 | A | * | 5/1994 | Walls et al. ............... 430/309 |
| 5,534,381 | A | * | 7/1996 | Ali et al. .................. 430/156 |
| 5,646,218 | A | | 7/1997 | Lynch et al. |
| 5,840,467 | A | | 11/1998 | Kitatani et al. |
| 6,060,217 | A | | 5/2000 | Nguyen et al. |
| 6,060,218 | A | | 5/2000 | Van Damme et al. |
| 6,060,222 | A | * | 5/2000 | West et al. ............... 430/326 |
| 6,074,802 | A | | 6/2000 | Murata et al. |
| 6,110,646 | A | | 8/2000 | Urano et al. |
| 6,117,613 | A | | 9/2000 | Kawauchi et al. |
| 6,238,838 | B1 | | 5/2001 | Gaschler et al. |
| 6,255,033 | B1 | | 7/2001 | Levanon et al. |
| 6,280,899 | B1 | | 8/2001 | Parsons et al. |
| 6,326,122 | B1 | | 12/2001 | Nagasaka et al. |
| 6,331,375 | B1 | | 12/2001 | Kawamura et al. |
| 6,346,365 | B1 | | 2/2002 | Kawauchi et al. |
| 6,410,203 | B1 | | 6/2002 | Nakamura |
| 6,410,207 | B1 | | 6/2002 | Nagasaka et al. |
| 6,444,393 | B2 | | 9/2002 | Nakamura et al. |
| 6,472,119 | B1 | | 10/2002 | Verschueren et al. |
| 6,485,890 | B2 | | 11/2002 | Parsons et al. |
| 6,506,536 | B2 | | 1/2003 | Pappas et al. |
| 6,537,735 | B1 | | 3/2003 | McCullough et al. |

FOREIGN PATENT DOCUMENTS

| | | |
|---|---|---|
| EP | 0 913 253 B1 | 5/1999 |
| WO | WO 03/079113 | 9/2003 |
| WO | WO 2004/020484 | 3/2004 |
| WO | WO 2004/081662 | 9/2004 |

* cited by examiner

*Primary Examiner*—John S. Chu
(74) *Attorney, Agent, or Firm*—J. Lanny Tucker

(57) ABSTRACT

A positive-working radiation-sensitive composition for use with a radiation source comprises one or more polymers capable of being eluted in an alkaline aqueous solution and a development-enhancing compound. The invention provides a positive-working photosensitive composition of good sensitivity for use with one or both of ultra-violet radiation and an infrared laser radiation source. The composition is stable in its state before exposure and has an excellent handling property. The sensitivity of a radiation-sensitive coating based on the composition of this invention is increased without compromising the handling characteristics. Radiation-sensitive elements based on the composition of the invention have good development latitude. A positive-working lithographic printing precursor is based on the radiation-sensitive composition coated on a hydrophilic surface. The precursor is developable using an alkaline aqueous solution, and may be used with a radiation source in lithographic applications, such as conventional imaging systems, computer-to-plate systems or other direct imaging applications. The precursor is stable in its state before exposure and has an excellent handling property.

32 Claims, No Drawings

DUAL-WAVELENGTH POSITIVE-WORKING RADIATION-SENSITIVE ELEMENTS

CROSS-REFERENCE TO RELATED APPLICATION

This application claims the benefit of provisional application No. 60/582,085, filed Jun. 24, 2004.

FIELD OF INVENTION

The invention pertains to the field of radiation-sensitive compositions and, in particular, to their use in imaging elements.

BACKGROUND OF INVENTION

Lithographic processes involve establishing image (printing) and non-image (non-printing) areas on a substrate, substantially on a common plane. When such processes are used in printing industries, non-image areas and image areas are arranged to have different affinities for printing ink. For example, non-image areas may be generally hydrophilic or oleophobic and image areas may be oleophilic.

The types of electronic parts whose manufacture may use a radiation-sensitive composition include printed wiring circuit boards, thick-and thin-film circuits, comprising passive elements such as resistors, capacitors and inductors; multichip devices; integrated circuits; and active semiconductor devices. The electronic parts may suitably comprise conductors, for example copper board; semiconductors, for example silicon, or germanium or Group III-V compound materials; and insulators, for example silica, as a surface layer with silicon beneath, with the silica being selectively etched away to expose portions of the silicon beneath. In relation to masks, a required pattern may be formed in the coating on the mask precursor, for example a plastics film, which is then used in a later processing step, in forming a pattern on, for example, a printing or electronic part substrate.

Conventionally, laser direct imaging methods (LDI) have been known which directly form an offset printing plate or printed circuit board on the basis of digital data from a computer. LDI offers the potential benefits of better line quality, just-in-time processing, improved manufacturing yields, elimination of film costs, and other recognized advantages. Examples of such methods include: (1) an electrophotographic method, (2) a photopolymerization method based on the combination of exposure by an Argon laser and post-heating, (3) a method in which a silver salt sensitive material is deposited on a photosensitive resin, (4) a method using a silver master and (5) a method in which a silicone rubber layer is decomposed by discharge breakdown or a laser beam.

However, in the electro-photographic method (1), processing such as charging, exposure and development are complicated, and the device used for the processing is complex and large. In method (2), a post-heating step is required. Further, a highly sensitive plate material is also required, and handling thereof in a light room is difficult. In methods (3) and (4), silver salts are used and thus the processing in these methods is complicated and the cost is high. Method (5) is a relatively complete method, but there remains a problem in that silicone dust remaining on the surface of the offset printing plate must be removed.

There has been remarkable development in the area of lasers. In particular, solid state lasers and semiconductor lasers having a luminous band from near infrared wavelengths to infrared wavelengths and which are small-sized and have a high energy output have become commercially available. These lasers are very useful as exposure light sources for exposure when LDI is required.

Thermally sensitive imaging elements are classified as compositions that undergo chemical transformation(s) in response to exposure to, and absorption of, suitable amounts of heat energy. The nature of thermally induced chemical transformation may be to ablate the composition, or to change the solubility of the composition in a particular developer, or to change tackiness of the surface, or to change the hydrophilicity or the hydrophobicity of the surface of the thermally sensitive layer. As such, selective heat exposure of predetermined areas (imagewise distribution of heat energy) of a film or layer formed of a thermally-sensitive composition has the capability of directly or indirectly producing a suitably imaged pattern which can serve as a resist pattern in printed circuit board fabrication, or in production of lithographic printing plates. Positive working systems based on novolak-diazoquinone resins are an imaging mainstay of the computer chip industry (see, e.g. R. R. Dammel, "Diazonaphthoquinone-based Resists", Tutorial text No. 11, SPIE Press, Bellingham. WA, 993).

Compositions of light sensitive novolak-diazoquinone resins are also widely used in printing plate fabrication. The light sensitive diazonaphthoquinone derivatives (DNQ) added to or reacted with novolak resins (a phenol-formaldehyde condensation polymer) slow down the elution of the resin. A revised molecular mechanism of novolak-DNQ imaging materials has been suggested (A. Reiser, Journal of Imaging Science and Technology, Volume 42, Number 1, January/February 1998, pp. 15-22). This text teaches that the basic features of the imaging phenomena in novolak-diazonaphthoquinone compositions is the observed inhibition of dissolution of the resin, based on the formation of phenolic strings by the interaction of the strong hydrogen acceptor which acts as a solubility inhibitor with the OH groups of the resin. On exposure, the hydrogen bonding between the phenolic strings is severed during a reaction known as the Wolff rearrangement, which follows photolysis of the diazoquinone moiety of the inhibitor molecule. This rearrangement is not only very fast, but also highly exothermic. ($\Delta H°$ is at least $-66$ kcal/mol). The sudden appearance at the location of the solubility inhibitor of a heat pulse of that magnitude, causes a major temperature spike of not less than about 220° C. At the high temperature that is produced at the location of the solubility inhibitor, the phenolic string is severed from its anchor at the DNQ and becomes inactive (dispersed). This happens because it is no longer held together by the inductive effect of the solubility inhibitor.

This model may also explains the fact that a wide range of heat sensitive compositions based on novolak resins, wherein different types of inhibitors are incorporated, have been suggested. For example, positive-working direct laser addressable printing form precursors based on phenolic resins sensitive to UV, visible and/or infrared radiation have been described. See, for example, U.S. Pat. No. 4,708,925, U.S. Pat. No. 5,372,907 and U.S. Pat. No. 5,491,046.

In U.S. Pat. No. 4,708,925, the phenolic resin dissolution in alkaline solution is decreased by a radiation-sensitive onium salt, such as triphenylsulfoniumhexafluorophosphate, instead of DNQ, with the native solubility of the resin being restored upon photolytic decomposition of the onium salt. The onium salt composition is intrinsically sensitive to UV radiation and can be additionally sensitized to infrared radiation.

U.S. Pat. Nos. 5,372,907 and 5,491,046 utilize direct positive-working systems based on a radiation-induced decomposition of a latent Bronsted acid to increase the solubility of the resin matrix on imagewise exposure. The described compositions can be additionally utilized as negative-working systems with additional processing after imaging and predevelopment. The onium salts, quinonediazide compounds or the like are not necessarily compatible with the alkali aqueous solution soluble polymer compound or the material that absorbs light to generate heat. Thus, it is difficult to prepare a uniform coating solution and to obtain a uniform and stable material for laser direct imaging.

In U.S. Pat. Nos. 6,037,085 and 5,962,192 thermal laser-sensitive compositions are described based on azide-materials wherein a dye-substance is added to obtain the requisite sensitivity.

A wide range of thermally-induced compositions, useful as thermographic recording materials, are disclosed in patent GB 1,245,924, whereby the solubility of any given area of the imageable layer in a given solvent can be increased by heating of the layer by indirect exposure to a short duration high intensity visible light and/or infrared radiation transmitted or reflected from the background areas of a graphic original located in contact with the recording material. Several systems are described which operate by many different mechanisms and use different developing materials ranging from water to chlorinated organic solvents. Included in the range of aqueous developable compositions disclosed, are those that comprise a novolak type phenolic resin. The patent describes coated films of such resins that show increased solubility on heating. The compositions may contain heat-absorbing compounds such as carbon black or Milori Blue (C.I. Pigment Blue 27); these materials additionally color the images for their use as a recording medium.

Other compositions that include dissolution-inhibiting materials are described in the patent literature. Examples include WO 97/39894, WO 98/42507, WO99/08879, WO99/01795, WO99/21725, U.S. Pat. No. 6,117,623, U.S. Pat. No. 6,124,425, EP 940266 and WO 99/11458. However, the infrared dye, or the like, functions only as a dissolution-inhibiting agent in the non-exposed portions, and does not promote the dissolution of the binder resin in the exposed portions.

In U.S. Pat. No. 5,840,467 Kitatani et al describe a positive working image recording material, which comprises a binder, a light-to-heat converter substance capable of generating heat by the absorption of infrared rays or near infrared rays, and a heat-decomposable substance capable of substantially lowering the solubility of the material when the substance is in the undecomposed state. Specific examples of the heat-decomposable substance are diazonium salts and quinonediazide, both of which are known to practitioners in the field to generate gas upon heating to a suitable temperature. Specific examples of the binder include phenolic, acrylic and polyurethane resins. Various pigments and dyes are given as potential light-to-heat converter substances, including specifically cyanine dyes. The image recording material may be coated onto suitable substrates to create an imageable element. Elements so created may be imagewise irradiated with laser light and the irradiated areas removed with an alkaline developer.

Several materials capable of increasing the sensitivity of positive-working compositions have been described. Cyclic anhydrides as sensitizers are described in U.S. Pat. No. 4,115,128; examples include phthalic anhydride, succinic anhydride and pyromellitic anhydride. Phenols and organic acids have also been described in JP-A Nos. 60-88942 and 2-96755. Specific examples include bisphenol A, 2,3,4-trihydroxybenzophenone, 4-hydroxybenzophenone, p-toluenesulfonic acid, dodecylbenzenesulfonic acid, phenyl phosphate, diphenyl phosphate, benzoic acid, isophthalic acid, adipic acid, terephthalic acid, lauric acid, and ascorbic acid or the like.

In U.S. Pat. No. 6,232,031 Fromson describes a positive-working coating composition and a lithographic printing plate formed with a coating of that composition. The invention provides an infrared imageable lithographic printing plate having a phenolic resin coating containing an o-diazonaphthoquinone derivative coupled to or reacted with the resin and an infrared radiation-absorbing compound which also couples with the resin by hydrogen bonding to insolubilize the resin coating.

SUMMARY OF INVENTION

A positive radiation-sensitive composition for use with a radiation source comprises an acetal polymer substance (A) capable of being eluted in an alkali aqueous solution, a radiation-sensitive substance (B) and an infrared light-to-heat converting substance (C). The invention provides a positive-working photosensitive composition of good sensitivity for use with one or both of ultra-violet radiation and an infrared laser radiation source. Applications of the composition include, but are not limited to, lithographic printing plates, such as conventional imaging systems, computer-to-plate systems or other direct imaging elements and applications. The composition is stable in its state before exposure and has excellent handling properties.

According to a first broad aspect of the invention, there is provided a radiation-sensitive composition comprising at least one aqueous alkali-eluable acetal polymer, a radiation-sensitive compound and an infrared light-to-heat converting compound. It is preferred to include a radiation-to-heat converting compound in the composition to match the sensitivity range of the composition to the wavelength of the radiation source. A developability enhancing substance (D) may be added to reduce the energy required to image elements prepared from the radiation-sensitive composition.

According to a second broad aspect of the invention, there is provided a positive-working imageable element comprising, on a substrate, a coating, the coating comprising the composition as aforesaid that is imageable by radiation, the radiation being one of ultra-violet and infrared, and is developable using an alkaline aqueous developer solution.

According to a third broad aspect of the invention, there is provided a radiation-sensitive printing precursor comprising, on a hydrophilic lithographic base with a hydrophilic lithographic printing surface, a coating, the coating comprising the composition as aforesaid. The precursor is imageable by radiation, the radiation being one of ultra-violet and infrared, and is developable using an alkaline aqueous developer solution.

In a further aspect of the invention, there is also provided a positive-working lithographic printing master comprising a precursor as aforesaid, imaged and developed. As further aspects of the invention, there are provided methods for the preparation of the precursor and the master.

DETAILED DESCRIPTION OF PREFFERED EMBODIMENT

The inventors have studied positive-working radiation-sensitive compositions, and have found that specific combinations of an alkali aqueous solution eluable acetal polymer substance (A), a radiation-sensitive substance (B) and an infrared light-to-heat converting substance (C) allow the fabrication of positive-working lithographic precursors using one or both of ultra-violet radiation and a infrared laser radiation source.

According to the present invention, a positive radiation-sensitive composition for use with a radiation source comprises, as acetal polymer substance (A), one or more alkali aqueous solution eluable acetal polymer compounds capable of being eluted in an alkali aqueous solution, a radiation-sensitive substance (B) and an infrared light-to-heat converting substance (C). A developability enhancing substance (D) may be added to reduce the energy required to image elements prepared from the radiation-sensitive composition.

The acetal polymer substance (A) has some degree of eluability in alkaline aqueous solution, though preferably a low degree. In a radiation-sensitive coating formed from the compositions of the invention, the composition has low eluability due either to substance (A)'s inherently low eluability, or interactions of moieties within substance (A)'s own molecules or interaction between materials in the composition for example based on hydrogen bonding or the like, alternatively steric effects may reduce developability.

The positive-working radiation-sensitive composition of the present invention may be coated on a suitable hydrophilic lithographic base to form a radiation-sensitive imageable layer, thereby creating an imageable element. In a preferred embodiment of the present invention, the positive-working radiation-sensitive composition is coated onto a hydrophilic lithographic base and dried, thereby to form a radiation-sensitive printing precursor. When the imageable layer is illuminated using one or both of ultra-violet radiation and an infrared laser radiation source, it becomes more eluable in alkaline aqueous solution. By addition of a developability-enhancing substance (D), the energy needed to expose the composition to obtain a desired level of developability, is decreased, as compared with a coating that does not contain developability-enhancing substance (D). Areas of the coating that are not exposed to the radiation (and are therefore not heated through the absorption and conversion of the radiation to heat) do not exhibit significant change in the rate of elution in developer. While the addition of developability-enhancing substance (D) may in fact to some degree increase the eluability of the coated and dried composition in alkaline aqueous solution, the increase in eluability of the coated and dried composition when illuminated is much enhanced. This provides an improved developability of the image that is formed by the radiation. The eluability in the irradiated areas does not restore to its pre-illumination value after any amount of time subsequent to such illumination. It is this differential in eluability that permits developability of the image that is formed by the radiation.

To the extent that one or more of the compounds employed in the radiation-sensitive composition of the present invention may decompose during imaging, the eluability in the irradiated areas does not restore to its original value after any amount of time subsequent to irradiation.

It is to be understood that an increase in the rate of eluability of the coating means, for purposes of the invention, an increase that is an amount useful in the image-forming process. It does not include any increase that is less than a useful amount in the image-forming process. The invention provides a positive photosensitive composition for use with a radiation source in lithographic applications, such as conventional imaging systems, computer-to-plate systems or other direct imaging elements and applications. It is stable in its state before exposure and has excellent handling properties.

Polymer Substance (A)

As acetal polymer substance (A) in the present embodiment, there may be used any substance having at least one acetal polymer comprising at least one acetal group having a directly attached phenolic group. There may be used not only a single polymer compound bearing such functionality or mixtures of such compounds, but also mixtures containing resin, as a copolymerized substance, 10 mole % or more of a phenolic resin.

By way of example there may used a polymer compound of the type described by U.S. Pat. No. 6,255,033 to Levanon et al. This patent describes an polyvinyl acetal polymer having phenolic groups, and also describes its synthesis by the grafting or condensation of aldehydes onto polyvinyl alcohol by acetalization. This polyvinyl acetal polymer can be used in the present invention, either alone, or in combination with other resins, as polymer substance (A) of the present invention. The specification of U.S. Pat. No. 6,255,033 is hereby incorporated in full. The general structure of the acetal polymer is given by the formula:

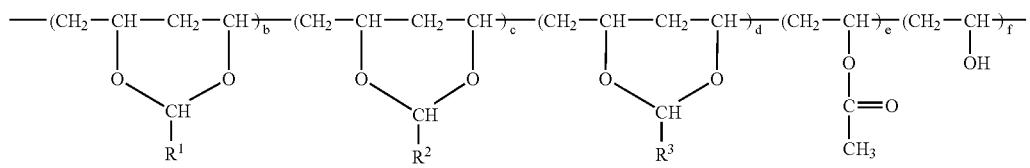

in which $R^1$ is $—C_nH_{2n+1}$ where n=1 to 12,
$R^2$ is

[structures shown with $R^4$, $R^5$, $R^6$]

wherein
$R^4=$—OH;
$R^5=$—OH or —OCH$_3$ or Br— or —O—CH$_2$—C≡CH
and
$R^6=$Br— or NO$_2$ and,
$R^3=$—(CH$_2$)$_t$—COOH, —C≡CH, or

[phenyl structure with $R^7$]

where $R^7=$COOH, —(CH$_2$)$_t$—COOH, —O—(CH$_2$)$_t$—COOH, and in which t=1 to 4, and where
b=5 to 40 mole %, preferably 15 to 35 mole % c=10 to 60 mole %, preferably 20 to 40 mole %
d=0 to 20 mole %, preferably 0 to 10 mole %
e=2 to 20 mole %, preferably 1 to 10 mole % and
f=5 to 50 mole %, preferably 15 to 40 mole %.

The polyvinyl acetal polymers of U.S. Pat. No. 6,255,033 used in the present invention can be described as:
  (i) tetrafunctional polymers, in which the recurring unit comprises a vinyl acetate moiety and a vinyl alcohol moiety and first and second cyclic acetal groups, or
  (ii) pentafunctional polymers in which the recurring unit comprises a vinyl acetate moiety, a vinyl alcohol moiety and first, second and third cyclic acetal group. All three of the acetal groups are six-member cyclic acetal groups. One of them is substituted with an alkyl group, another is subsituted with an aromatic group having a hydroxyl-, or a hydroxyl- and alkoxyl-, or hydroxyl-, and nitro- and bromine- groups; and a third is substituted with a carboxylic acid group, a carboxylic acid substituted alkyl group or a carboxylic acid substituted aryl group.

Examples of suitable aldehydes useful in preparing the first cyclic acetal group of the polyvinyl acetal polymers used in this invention include: acetaldehyde, propionaldehyde, n-butyraldehyde, n-valeraldehyde, n-caproaldehyde, n-heptaldehyde, isobutyraldehyde and isovaleraldehyde, their mixtures and the like.

Examples of suitable aldehydes useful in preparing the second cyclic acetal group of the polyvinyl acetal polymers used in this invention include 2-hydroxybenzaldehyde, 3-hydroxybenzaldehyde, 4-hydroxybenzaldehyde, 2-hydroxy-1-naphthaldehyde, 2,4-dihydroxybenzaldehyde, 3,5-dibromo-4-hydroxybezaldehyde, 4-oxypropynyl-3-hydroxybenzaldehyde, vanillin, isovanilin and cinnamaldehyde, their mixtures, and the like.

Examples of suitable aldehydes useful in preparing the third cyclic acetal group of the polyvinyl acetal polymers used in this invention include glyoxylic acid, 2-formylphenoxyacetic acid, 3-methoxy-4-formylphenoxy acetic acid and propargyl aldehyde, their mixtures and the like.

This polymer has the advantage that many different functional groups can be incorporated into it to tailor its properties to the specific applications. Examples of aldehydes that can be used in grafting include, for example, acetaldehyde, n-heptaldehyde, 2,4-dihydroxybenzaldehyde, 2-, 3- or 4-hydroxybenzaldehyde, vanillin, glyoxylic acid and propargyl aldehyde, for example, long chain alkyl aldehydes to reduce the softening point (Tg) of the polymer for ease of lamination for a dry film photoresist or aromatic aldehydes, such as cinnamaldehyde to increase the oleophilicity of the composition for use in a printing plate. The polymer preferably has a molecular weight range from 3,000 to 100,000.

Preparation of Acetal Polymers Employed in the Present Invention.

Acetalization of the polyvinyl alcohols takes place according to known standard methods as described, for example, in U.S. Pat. No. 4,665,124; U.S. Pat. No. 4,940,646; U.S. Pat. No. 5,169,898; U.S. Pat. No. 5,700,619; U.S. Pat. No. 5,792,823; JP 09,328,519 etc. In U.S. Pat. No. 6,255,033, Levanon et al. provide detailed synthesis examples for the acetal polymers used in the present invention.

Polymer 1

In a preferred embodiment of the present invention, the polymer employed as polymer substance (A) is derived from 3-hydroxybenzaldehyde and butyraldehyde by the following process, resulting in a polyvinyl acetal resin having butyral acetal groups and hydroxy-substituted aromatic acetal groups, herein referred to as polymer 1, the hydroxy-substitution being on the 3-position on the aromatic ring: 100 grams of Airvol 103 (trademark) a polyvinyl alcohol (a 98% hydrolyzed polyvinyl acetate having a number average molecular weight of about 15,000, supplied by Hoechst, Germany. Clariant, US), was added to a closed reaction vessel fitted with a water-cooled condenser, a dropping funnel and thermometer, and containing 150 grams of demineralized water and 25 grams of methanol. With continual stirring, the mixture was heated for 0.5 hour at 90° C. until it became a clear solution. After this, the temperature was adjusted to 60° C. and 3 grams of concentrated sulfuric acid in 50 grams of methanol were added. Over a 15 minutes period, a solution of 60 grams of 3-hydroxybenzaldehyde and 1.4 grams of 2,6-di-t-butyl-4-methylphenol in 450 grams of Dowanol PM™ were added in a drop-wise manner. The reaction mixture was diluted with additional 200 grams of Dowanol PM™, and 23.2 grams of n-butyraldehyde in 200 grams of Dowanol PM™ were added in a dropwise manner, upon complete addition of the aldehydes, the reaction was continued at 50° C. for additional 3 hours. At this stage the conversion of the butyraldhyde is completed and the conversion of the 3-hydroxybenzaldehyde is close to 50%. The water-Dowanol PM™ azeotrope is distilled out from the reaction mixture in vacuum, Dowanol PM™ is added to the reaction mixture during the distillation. The distillation is complete when the water content of the reaction mixture is lower than 0.1%. The conversion of the 3-hydroxybenzaldehyde is higher than 97%. The reaction mixture is precipitated in water. The resulting polymer is filtered, washed with water and dried at 60° C. for 3 days to a water content of 2%.

Polymer 2

In a preferred embodiment of the present invention, the polymer employed as polymer substance (A) is derived from 3-hydroxybenzaldehyde, butyraldehyde and cinnamaldehyde by, resulting in a polyvinyl acetal resin having butyral acetal groups, cinnamal acetal groups and hydroxy-substituted aromatic acetal groups, herein referred to as polymer 2, the hydroxy-substitution being in the 3-position on the aromatic ring. The preparation of polymer 2 is identical to that of polymer 1, except that addition of the 3-hydroxybenzaldehyde is followed by addition of 14,7 grams of cinnamaldehyde in 150 g of Dowanol PM™ and followed by 16 grams of butyraldehyde in 200 g of Dowanol PM™. The presence of cinnamaldehyde in the composition of polymer 2 is thought to improve the ink-attracting ability of the imageable areas of the plate.

Polymer 3

In a preferred embodiment of the present invention, the polymer employed as polymer substance (A) is derived from 2-hydroxybenzaldehyde and butyraldehyde, resulting in a polyvinyl acetal resin having butyral acetal groups and hydroxy-substituted aromatic acetal groups, herein referred to as polymer 3, the hydroxy-substitution being on the 2-position of the aromatic ring. The preparation of polymer 3 is identical to that of polymer 1 except that the Airvol 103 polyvinyl alcohol was replaced by Poval 103 and 2-hydroxybenzaldehyde (90 grams in 500 grams of Dowanol PM™) was used instead of the 3-hydroxybenzaldehyde followed by addition of 12 grams of butyraldehyde in 200 grams of Dowanol PM™.

Polymer 4

In a preferred embodiment of the present invention, the polymer employed as polymer substance (A) is derived from 2-hydroxybenzaldehyde and butyraldehyde, resulting in a polyvinyl acetal resin having butyral acetal groups and hydroxy-substituted aromatic acetal groups, herein referred to as polymer 4, the hydroxy-substitution being on the 2-position of the aromatic ring. The preparation of polymer 4 is identical to that of polymer 3 except that the amount of 2-hydroxybenzaldehyde used was 68 grams and the amount of the n-butyraldehyde was 23.2 grams.

The polymer compounds described in this specification, preferably has a weight-average molecular weight of 2,000 to 300,000, and a dispersion degree (weight-average molecular weight number-average molecular weight) of from 1.1 to 10.

A single polymer may be employed as polymer substance (A) alone, or two or more types of polymers may be used in combination. The amount thereof is from 30 to 95 weight %, preferably from 40 to 90 weight % and especially preferably from 50 to 90 weight % of the entire content of solids in the composition. If the added amount of the polymer substance (A) is less than 30 weight %, the durability of the imageable layer deteriorates. If the added amount is more than 95% by weight, the sensitivity to radiation deteriorates.

Radiation-Sensitive Substance (B)

The composition of the present invention comprises a radiation-sensitive substance (B) that absorbs ultra-violet light, decomposes and thereby causes an increase in the eluability of the composition. The unreacted radiation-sensitive substance (B) may also inhibit the elution of the composition in unirradiated regions of the coated and dried composition.

The radiation-sensitive substance (B) is preferably used in an amount of from 0.1 to 30% by weight, more preferably from 0.3 to 20% by weight, based on the total solids content of the photosensitive composition.

The radiation-sensitive substance (B) is a compound having at least one of an onium or quinonediazide group.

In the present invention, the term compounds having an onium group is taken to mean any compound containing an onium group, which is intrinsically sensitive to UV radiation and can be additionally sensitized to infrared radiation, examples of such onium moieties and their derivatives include: ammonium, iodonium, sulphonium, bromonium, chloronium, oxysulphonium, sulphoxonium, selenonium, telluronium, phosphonium, arsonium salts, and the organic and polymeric derivatives of such onium moeities. Specific examples of onium compounds are: diphenyliodonium hexafluorophosphate, triphenylsulfonium hexafluoroantimonate, phenylmethyl-ortho-cyanobenzylsulfonium trifluoromethane sulfonate, and 2-methoxy-4-aminophenyl diazonium hexafluorophosphate.

The onium compound may incorporate any organic or inorganic counter ion. Examples of organic anions include carboxylate and sulphonate anions and examples of suitable inorganic anions include halide, sulphate, and complex anions containing halogen moeties such as hexafluorophosphate.

In the present invention, quinonediazide compounds of various structures can be used. In particular o-benzoquinonediazido radical or o-naphthoquinonediazide radical derived compounds, and compounds having various structures, such as those compounds as detailed in J. Kosar, the "Light-Sensitive System" (published by John Wiley & Sons, Inc. in 1965) pp. 339 to 353, can be used. In particular, sulfonic esters or sulfonic amides of quinonediazides prepared by reacting o-quinonediazide and an aromatic polyhydroxyl compound or an aromatic amino compound are preferred. Esters between benzo-quinone-1,2-diazidosulfonyl chloride or naphthoquinone-1,2-diazido-5-sulfonyl chloride and a phenol are also preferred. These quinonediazide compounds may be used either individually or in combination of two or more thereof. Further examples of quinonediazide compounds include the ester of benzoquinone-(1,2)-diazidosulfonic acid or naphthoquinone-(1,2)-diazidosulfonic acid with the acetal polymer compound (A); the amount of substitution on the resin by the quinonediazide is preferably between 0.1 and 25% and more preferably 0.3 and 20% by weight.

While not wishing to be bound to a particular theory, the inventors believe the radiation-sensitive substance (B) when exposed to ultraviolet or visible radiation renders a gaseous phase upon heating. The gaseous phase being produced by either, decomposition of the radiation-sensitive substance (B), evaporation of the radiation-sensitive substance (B) or a reaction of the radiation-sensitive substance (B) with another moiety within the positive-working radiation-sensitive composition.

Infrared Light-to-Heat Converting Substance (C)

To provide light-absorption of the laser energy in the composition of the present invention, an infrared light-to-heat converting substance (C), capable of absorbing incident radiation, preferably infrared radiation, and converting it to heat is preferably incorporated in the coating composition. The infrared radiation source for use is preferably a solid state laser or a semiconductor laser.

Preferable infrared absorbing materials for use as radiation-to-heat converting compounds are those absorbing at wavelengths longer that 700 nm, such as between about 700 and 1300, with near infrared absorbing materials between about 700 and 1000 nm being generally used. Preferably infrared absorbing materials are chosen to have a wavelength of maximum absorbtion (lambda.max) within 10 nm of the wavelength of maximum output of the radiation source.

The radiation absorbing materials suitable for the invented heat-sensitive compositions may be chosen from a wide range of organic and inorganic pigments and dyes.

The radiation absorbing pigments that can be used may be chosen from a wide range of organic and inorganic pigments such as carbon blacks, phthalocyanines or metal oxides. Green pigments: Heliogen Green D8730, D 9360, and Fanal Green D 8330 produced by BASF; Predisol 64H-CAB678 produced by Sun Chemicals, and black pigments: Predisol CAB2604, Predisol N1203, Predisol Black CB-C9558 produced by Sun Chemicals Corp., are examples of effective heat absorbing pigments, and other classes of materials absorbing in the near infrared region are known to those skilled in the art.

These pigments may be used with or without being subjected to surface treatment. Methods for surface treatment include methods of applying a surface coat of resin or wax, methods of applying surfactant, and methods of bonding a reactive material (for example, a silane coupling agent, an epoxy compound, polyisocyanate, or the like) to the surface of the pigment. These methods for surface treatment are described in "Properties and Application of Metallic Soap" (published by Saiwai Shobo), "Printing Ink Technology" (CMC Publications, published in 1984) and "Latest Pigment Applied Technology" (CMC Publications, published in 1986).

The particle size of the pigments is preferably from 0.01 to 10 μm, more preferably from 0.05 to 1 μm and especially preferably from 0.1 to 1 μm. A particle size of the pigment of less than 0.01 μm is not preferred from the standpoint of the stability of the dispersed pigment in a photosensitive layer coating liquid. A particle size of more than 10 μm is not preferred from the standpoint of uniformity of the formed infrared sensitive layer.

The method for dispersing the pigment in the composition that can be used may be any known dispersion method that is used for the production of ink or toner or the like. Dispersing machines include an ultrasonic disperser, a sand mill, an attritor, a pearl mill, a super mill, a ball mill, an impeller, a disperser, a KD mill, a colloid mill, a dynatron, a three-roll mill and a press kneader. Details thereof are described in "Latest Pigment Applied Technology" (CMC Publications, published in 1986).

For the infrared laser sensitive compositions, the dyes that can be used may be any known infrared dyes, such as commercially available dyes or dyes described in, for example, "Dye Handbook" (edited by the Organic Synthetic Chemistry Association, published in 1970). Specific examples of dyes which absorb infrared or near infrared rays are, for example, cyanine dyes disclosed in Japanese Patent Application Laid-Open (JP-A) Nos. 58-125246, 59-84356, 59-202829, and 60-78787; methine dyes disclosed in JP-A Nos. 58-173696, 58-181690, and 58-194595; naphthoquinone dyes disclosed in JP-A Nos. 58-112793, 58-224793, 59-48187, 59-73996, 60-52940 and 60-63744; squarylium colorant disclosed in JP-A No. 58-112792; substituted arylbenzo(thio)pyrylium salts described in U.S. Pat. No. 3,881,924; trimethinethia pyrylium salts described in JP-A No. 57-142645 (U.S. Pat. No. 4,327,169); pyrylium-based compounds described in JP-A Nos. 58-181051, 58-220143, 59-41363, 59-84248, 59-84249, 59-146063, and 59-146061; cyanine colorant described in JP-A No. 59-216146; pentamethinethiopyrylium salts described in U.S. Pat. No. 4,283,475; and pyrylium compounds, Epolight III-178, Epolight III-130 and Epolight III-125 described in Japanese Patent Application Publication (JP-B) Nos. 5-13514 and 5-19702 and cyanine dyes disclosed in British Patent No. 434,875.

The pigments or dyes may be added into the radiation-sensitive medium for a printing plate, or to other compositions, such as an etch resist in an amount of from 0.01 to 30 weight %, preferably from 0.1 to 10 weight %, and especially preferably from 0.5 to 10 weight % in the case of the dye and from 3 to 13 weight % in the case of a pigment, with respect to the entire amount of solids in the material for the printing plate. If the pigment or dye content is less than 0.01 weight %, sensitivity is lowered. If this content is more than 30 weight %, uniformity of the photosensitive layer is lost and durability or other properties such as etch resistance of the imageable layer deteriorates.

In a further embodiment of the present invention, the positive radiation-sensitive medium of the present invention is prepared without the infrared light-too-heat converting substance (C). The radiation-sensitive medium may be incorporated into a positive-working lithographic printing precursor in an imageable layer that is separate from, but adjacent to, the layer comprising the converting substance (C). While it is possible to coat the layer comprising the converting substance (C) on top of the imageable layer comprising the radiation-imageable medium, the preferred arrangement is to have the layer comprising the converting substance (C) sandwiched between the imageable layer and the hydrophilic lithographic base, the imageable layer being transparent to the radiation employed for imaging. When the combined layer structure is illuminated, the layer comprising the converting substance (C) produces heat in the illuminated areas, the heat being then imagewise transferred to the adjacent imageable layer comprising the radiation-sensitive medium. The radiation-sensitive medium then becomes more soluble in alkaline aqueous solution in the imagewise heated areas. The result is a decrease in the energy needed in exposing the composition to obtain a desired level of developability, as compared with a coating that does not contain substance (B). The term "hydrophilic lithographic base" is used herein to describe a plate or sheet of material of which at least one surface is hydrophilic, thereby allowing it to hold water or aqueous media, such as fountain solution.

Developability Enhancing Substance (D)

The developability-enhancing compound, used as substance (D), may be any one or more of the following class of compounds:

1. Hydroxyl and thiol-containing compounds such as alcohols, phenols, naphthols, thiols and thiophenols. The alcohols may have an alkyl radical of 12-60 carbon atoms or a fluoroalkyl containing 4-60 carbon atoms or a fluoroalkylaryl containing 7-60 carbon atoms. An example of a suitable polyol is Dimethicone copolyol SF 1488. An example of a monohydric phenol is nonyl phenol. Examples of dihydric phenols are resorcinol and alkyl resorcinols such as 4-hexylresorcinol and n-dodecylresorcinol. Examples of trihydric phenols are: pyrogallol, phloroglucinol, 1,2,4-benzenetriol and their alkyl or fluoroalkyl derivatives. An example of a suitable thiol containing compounds is 1-phenyl-1H-tetrazole-5-thiol. An example of a napthole is 1-Naphthole.

2. An anionic lithium salt that is one of a carboxylate, thiocarboxylate, sulfate, sulfonate, phosphate, phosphite, nitrate and nitrite; Examples of lithium salts of organic acids are lithium 3-(1H,1H,2H,2H-fluoroalkyl) propionate and 3-[(1H,1H,2H,2H-fluoroalkyl)thio]propionate, lithium trifluoromethane sulfonate and lithium perfluorooctylethylsulfonate.

3. Esters and amides of phosphorous-containing acids, preferably having free hydroxyl groups. Examples of phosphorous-containing esters are those with structures P(OH)(OR)$_2$, P(OH)$_2$(OR), P(OH)$_2$[O—R—N(CH$_2$—CH$_2$—OH)$_2$], P(OR)$_2$[O—R—NH(CH$_2$—CH$_2$—OH)$_2$], where R is an alkyl, aryl, alkylaryl, polyethylene oxide, polypropyleneoxide or combination thereof, and where the R radical may contain fluorine atoms. Other suitable compounds are alkyl phosphonic acids, R—P(O)(OH)$_2$, as well as their esters and salts, where R is as defined above. Examples of suitable phosphorous-containing amides are P(OH)(ONHR)$_2$, P(OH)$_2$(ONHR), P(OR)$_2$[O—NH(CH$_2$—CH$_2$—OH)$_2$], P(OR)[O—NH(CH$_2$—CH$_2$—OH)$_2$]$_2$, where R is an alkyl, aryl, polyethylene oxide, polypropyleneoxide and combinations thereof, and where R may contain fluorine atoms.

4. Polysiloxane with free hydroxyl groups. Preferably, the free hydroxyl groups are terminal ones. Examples of suitable compounds are those with structure R[OSi(OCH$_3$)$_2$]$_n$—Si(OCH$_3$)(OH)$_2$, where R is an alky, aryl, polyethyleneoxide, polypropyleneoxide group or combinations thereof and n is 2 to 1000.

5. Quaternary ammonium salts of phosphorous-containing acids, preferably having free hydroxyl groups. An example of a quaternary ammonium salt containing hydroxyl groups is the diethanolamine salt of perfluoroalkyl substituted polyethyleneoxide phosphite.

6. Compounds containing the azo functional group —N=N—

Examples from this class of compounds are:

azonitriles such a compound is: 2-[(1-cyano-1-methyl)azo] formamide, azoamide compounds such as 2,2'-azobis(2-methyl-N-[1,1-bis(hydroxyethyl)-2-hydroxyethyl] propionamide).

azoamidine and cyclic azoamidine compounds such as 2,2'-azobis(2-amidinopropane) dihydrochloride.

other azo compounds such as: 2,2'-azobis(2-methyl propionamide oxime).
7. Linear and cyclic compounds containing the following groups:

—NH—NH— and

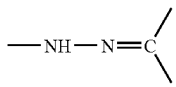

Examples of the linear compounds are:

R⁸—NH—NH—R⁹ and

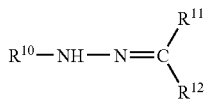

where
R¹⁰=CH₃—C₆H₄—SO₂— or C₆H₅—SO₂— and
R¹¹, R¹²=—C$_n$H$_{2n+1}$ where n=1 to 20 and
where R¹ and R² are present in one of the following combinations:
R⁸=H and R⁹ is one of C₆H₅—SO₂—,
  CH₃—C₆H₄—SO₂—,
  —SO₂—C₆H₄—O—C₆H₄—SO₂—NH—NH₂ and
  —SO₂—C₆H₃(CH₃)—O—C₆H₃(CH₃)—SO₂—NH—NH₂ and
R⁸=—CONH₂ and R⁹ is one of C₆H₅—SO₂— and
  CH₃—C₆H₄—SO₂—

Examples of cyclic compound are benzotriazoles, 5-phenyl-1H-tetrazole and 1-phenyl-1H-tetrazole-5-thiol. Some of the above compounds are used as foaming agents.

8. Compounds with the following structures:

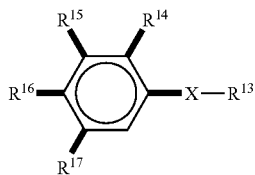

Where X is one of —S—, S=O, C=O, C—O(NH) or C=O(O) and where R¹³ can be H or C₁ to C₁₂-alkyl, benzyl or structure E, where E is given by

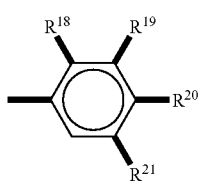

and where R¹⁴, R¹⁵, R¹⁶, R¹⁷, R¹⁸, R¹⁹, R²⁰, R²¹ can be one of Br, Cl, F, NO₂, H or OH.

Examples of such compounds include 2,2',4,4'-tetrahydroxy-diphenyl sulphide and 2,2',4,4'-tetrahydroxy-diphenyl sulphoxide . . .

9. Substituted aromatic amides, acids and esters of them such as 2,4-dichlorobenzamide, 3-nitrobenzamide, 2-nitrobenzoic acid, 3-nitrobenzoic acid, 2,4-dinitrobenzoic acid, 2,4-dichlorobenzoic acid, 2-hydroxy-1-naphthoic acid, 2,4-dihydroxybenzoic acid, methyl salicylate, phenylsalicylate, methyl-4-hydroxybenzoate, butyl-4-hydroxybenzoate etc.

10. Sulfones such as dimethylsulfone.

In general, the composition ratio of the polymer substance (A) to the substance (D) is preferably from 99/1 to 60/40. The developability-enhancing compound D) must be present in an amount that is effective to significantly increase the sensitivity of the coating to the developer in the radiation-exposed areas of the coating, that is, increased by an amount useful in the image-forming process. If the amount of substance (D) is lower than this lowest limit, the substance (D) does not significantly improve the sensitivity of the coating. If the amount of substance (D) is more than the aforementioned upper limit, the tolerance to developer of unimaged coating is significantly reduced. Thus, both cases are not preferred. More preferred ranges for substance (D) are 1.5% to 20% and most preferred ranges are 5% to 15%, measured by weight relative to the total solids in the coating composition.

Aqueous-Eluability Retarding Substance (E)

The term "aqueous-ineluable" is used to mean a property of a radiation-sensitive medium coated on a substrate, whereby the radiation-sensitive medium is not dissolved or otherwise dispersible by an aqueous eluent. An aqueous-eluability retarding substance (E) is a substance which reduces the aqueous-eluable property. It must be remembered that nearly any material may be eluted, etched or dissolved, so that this term applies only to fluids that are intended to be used in the treatment of the layer (e.g., water, low alkaline content aqueous solutions, acidic solutions, aqueous solutions with low amounts of organic compounds such as 10% isopropanol or methoxypropanol, and other fountain solutions used on printing presses.)

A compound that hinders the elution of the dried composition in the alkaline aqueous solution, herein referred to as a "aqueous-eluability retarding substance (E)" may optionally be included in the coating composition. Such compounds include, but are not limited to:

1. Nitrogen containing compounds wherein a least one nitrogen atom is either quarternised, incorporated in a heterocyclic ring or quarternised and incorporated in a heterocyclic ring. Examples of useful quarternised nitrogen containing compounds are quinoline and triazols, imidazoline compounds, such as Monazoline C, Monazoline O, Monazoline CY and Monazoline T all of which are manufactured by Mona Industries, quinolinium compounds, such as 1-ethyl-2-methyl quinolinium iodide and 1-ethyl-4-methyl quinolinium iodide, benzothiazolium compounds, such as 3-ethyl-2-methyl benzothiazolium iodide, usefully the quinolinium or benzothiazolium compounds are cationic cyanine dyes, such as, Quinoldine Blue and 3-ethyl-2-[3-(3-ethyl-2 (3H)-benzothiazolylidene)-2-methyl-1-propenyl]benzothiazolium iodide, pyridinium compounds, such as cetyl pyridinium bromide, ethyl viologen dibromide and fluoropyridinium tetrafluoroborate, triaryl methane dyes such as Crystal Violet (CI basic violet 3) and Ethyl Violet and tetraalkyl ammonium compounds such as Cetrimide.

2. Carbonyl functional group containing compounds.

Examples of suitable carbonyl containing compounds are .alpha.-naphthoflavone, β-naphthoflavone, 2,3-diphenyl-1-indeneone, flavone, flavanone, xanthone, benzophenone, N-(4-bromobutyl)phthalimide and phenanthrenequinone.

3. A compound of general formula

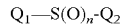

Where $Q_1$ represents an optionally substituted phenyl or alkyl group, n represents 0, 1 or 2, and $Q_2$ represents a halogen atom or an alkoxy group. Preferably $Q_1$ represents a $C_{1-4}$ alkyl phenyl group, for example a tolyl group, or a $C_{1-4}$ alkyl group. Preferably n represents 1 or, especially, 2. Preferably $Q_2$ represents a chlorine atom or a $C_{1-4}$ alkoxy group, especially an ethoxy group.

4. Ferrocenium compounds, such as ferrocenium hexafluorophosphate.

Particularly useful are dyes, such as Victoria Pure Blue BO7, Crystal Violet (CI42555), Methyl Violet (CI42535), Ethyl Violet, Malachite Green (CI42000), Methylene Blue (CI52015), or the like. The use of such compounds is preferred where the inherent solubility of the polymer is relatively high.

In order to achieve processing stability in a broader range of processing conditions, a surfactant may optionally be included in the compositions of the invention. Suitable non-ionic surfactants are described in JP-A Nos. 62-251740 and 3-208514 and amphoteric surfactants described in JP-A Nos. 59-121044 and 4-13149. The amount of the non-ionic or amphoteric surfactant is preferably from 0.05 to 10 weight percent and more preferably from 0.1 to 5 by weight % of the material for the composition.

A surfactant for improving the applying property, for example, any of the fluorine-containing surfactants such as, for example, Zonyl's (DuPont) or FC-430 or FC-431 (Minnesota Mining and Manufacturing Co.) or alternatively polysiloxanes such as Byk 333 (Byk Chemie), may be added into the infrared sensitive layer. The amount of the surfactant added is preferably from 0.01 to 1 weight % and more preferably from 0.05 to 0.5 weight % of the entire material for the composition.

Image colorants may optionally be included in the compositions of the invention in order to provide a visual image on the exposed plate prior to inking. As the image colorant, dyes other than the aforementioned salt-forming organic dyes may be used. Examples of preferred dyes, including the salt forming organic dyes, are oil-soluble dyes and basic dyes. Specific examples are Oil-Yellow #101, Oil Yellow #103, Oil Pink #312, Oil Green BG, Oil Blue BOS, Oil Blue #603, Oil Black BY, Oil Black BS, Oil Black T-505 (all of which are manufactured by Orient Chemical Industries Co,. Ltd.), provided they do not compete with the ultra-violet light absorption function of compound (B) of the composition, Pure Blue BO, the tetrafluoroborate salt of Basic Blue. Specific examples include Victoria Pure Blue BO7, Crystal Violet (CI42555), Methyl Violet (CI42535), Ethyl Violet, Malachite Green (CI42000), Methylene Blue (CI52015), or the like. The dye may be added into the material for the printing plate in an amount of preferably from 0.01 to 10 weight % and more preferably from 0.5 to 8 weight % of the entire solid contents of the material for the composition.

A plasticizer for providing the formed film with softness may be added as needed in the material for the compositions of the invention. The plasticizer may be e.g. butylphthalyl, polyethyleneglycol, tributyl citrate, dibutyl phthalate, dioctyl phthalate, tricresyl phosphate, tributyl phosphate, tetrahydrofurfuryl oleate, an oligomer or polymer of acrylic acid or methacrylic acid, or the like, sorbitan tristearate, sorbitan monopalmitate, sorbitan trioleate, monoglyceride stearate, polyoxyethylene-nonylphenylether, alkyldi(aminoethyl)glycine, alkylpolyaminoethylglycine hydrochloride, 2-alkyl-N-carboxyethyl-N-hydroxyethylimidazolium betaine, N-tetradecyl-N,N-betaine (e.g., trade name Amogen, manufactured by Dai-ichi Kogyo Co., Ltd.), and the like.

Suitable adhesion promoters may optionally be included in the compositions of the invention. Suitable ones include di-acids, triazoles, thiazoles and alkyne containing materials. The adhesion promoters are used in amounts between 0.01 and 3% by weight. Other polymers may be added to reduce the cost of the formulation. Examples include urethane and ketone resins. The amounts of these materials can vary between 0.5% and 25%, preferably between 2% and 20% by weight of solids.

In general, the composition ratio of the polymer compound (A) to the compound (B) is preferably from 99/1 to 60/40. The radiation-sensitive compound (B) must be present in an amount that is effective to significantly increase the sensitivity of the coating to the developer in the radiation-exposed areas of the coating, that is, increased by an amount useful in the image-forming process. If the amount of compound (B) is lower than this lowest limit, the compound (B) does not significantly improve the sensitivity of the coating. If the amount of compound (B) is more than the aforementioned upper limit, the tolerance to developer of unimaged coating is significantly reduced. Thus, both cases are not preferred. More preferred ranges for compound (B) are 1.5% to 20% and most preferred ranges are 5% to 15%, measured by weight relative to the total solids in the coating composition.

The radiation-sensitive printing precursor of the present invention can be produced by dissolving the aforementioned respective substances into an appropriate solvent, filtering if necessary, and applied from a liquid in a manner known, such as, for example, bar coater coating, spin coating, rotating coating, spray coating, curtain coating, dip coating, air knife coating, blade coating, and roll coating, or the like, onto a hydrophilic lithographic base. Appropriate solvents include methylenechloride, ethylenedichloride, cyclohexanone, methylethyl ketone, acetone, methanol, propanol, ethyleneglycolmonomethylether, 1-methoxy-2-propanol, 2-methoxyethyl acetate, 1-methoxy-2-propyl acetate, dimethoxyethane, methyl lactate, ethyl lactate, and toluene or the like. A single solvent may be used alone, or a combination of two or more solvents may be used. The concentration of the aforementioned substances (all of the solid substances including the additives) in the solvent is preferably from 1 to 50 weight %. The applied amount (of the solid) on the hydrophilic lithographic base obtained after application and drying differs in accordance with the use, but in general, is preferably from 0.3 to 12.0 grams per square meter according to the application. Lesser amounts can be applied to the hydrophilic lithographic base, resulting in a higher apparent sensitivity, but the film characteristics of the material are deteriorated.

The radiation-sensitive compositions of the present invention are useful for production of printed circuit boards, for lithographic printing plates and other heat-sensitive elements suitable for direct imaging, including but not limited to laser direct imaging (LDI). In the case of lithographic printing, the radiation-sensitive printing precursor of the present invention employs a hydrophilic lithographic base which may, in a general case, comprise a separate hydrophilic layer over a substrate, such that, when the precursor is developed, the hydrophilic coating layer remains, and is employed in the printing process for retaining aqueous media such as fountain solution. In such a case, there is great latitude in choosing a substrate on which to coat the hydrophilic layer. Alternatively, the hydrophilic lithographic base may be of a single material and this material, which may typically be aluminum, may be treated to assure a hydrophilic surface property.

Suitable substrates may include, for example, paper; paper on which plastic such as polyethylene, polypropylene, polystyrene or the like is laminated; a metal plate such as an aluminum, anodized aluminum, zinc or copper plate; a copper foil, reverse treated copper foil, drum side treated copper foil and double treated copper foil clad on a plastic laminate, a plastic film formed of, for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal; a paper or a plastic film on which the aforementioned metal is vapor-deposited or laminated; glass or glass in which a metal or metal oxide is vapor deposited or the like.

As the substrate in the present embodiment for a printing plate, a polyester film, or an aluminum plate is preferred, and an aluminum plate is especially preferred because of its stable dimensions and relatively low cost. A plastic film on which aluminum is laminated or vapor-deposited may be used. The composition of the aluminum plate applied to the present invention is not specified, and the aluminum plate may be prepared according to any of the known methods, for example of roughening, anodizing and post anodizing treatments. The thickness of the aluminum plate used in the present embodiment is from about 0.1 to 0.6 mm, preferably from 0.15 to 0.5 mm.

The radiation-sensitive printing precursor produced as described above is usually subjected to image-exposure and developing processes. In a preferred embodiment, radiation-sensitive compositions as described above are applied as a coating on a hydrophilic lithographic base (for example an aluminum plate) to form a lithographic printing precursor. The precursor can be imaged (for example by imagewise exposure to one or both of ultra-violet and infrared radiation), and the imaged precursor developed to form a positive-working lithographic printing plate, using a conventional alkaline aqueous developer solution. When the precursor has a separate imageable layer and layer comprising the converter substance, the development process removes both layers, to reveal the underlying hydrophilic surface.

In a preferred embodiment of the invention, the light source for an active light beam which is used in the image-exposure, is preferably a light source emitting light having a luminous wavelength within the ranges 320 nm to 450 nm for the ultra-violet function, and from 700 nm to 1300 nm in the infrared and is especially preferably a solid state laser or a semiconductor laser. Preferably, the radiation-sensitive printing precursor based on the radiation-sensitive medium of the present invention is sensitive to radiation of wavelength between 320 nm to 450 nm for the ultra-violet function, and 700 nm and 1300 nm, and more preferably between 700 nm and 1000 nm for the infrared function.

The developing solution and replenishing solution for the radiation-sensitive printing precursor of the present invention may be a conventionally known alkali aqueous solution such as, for example, sodium metasilicate, potassium tertiary phosphate, ammonium secondary phosphate, sodium carbonate, potassium borate, sodium hydroxide, ammonium hydroxide, potassium hydroxide, tetraalkylammonium hydroxides; and organic alkali agents such as, alkyl amines, alkyl ethanolamines or diamines. The alkali agent may be used alone, or a combination of two or more may be used.

Among these, especially preferred developing solutions are aqueous solutions of silicates and hydroxides. It is known that when development is carried out by using an automatic developing machine, an aqueous solution (a replenishing solution) having a higher basicity than that of the developing solution is added to the developing solution so that many plates or pieces of can be processed without having to replace the developing solution in the developing tank for a long time. In the present embodiment, such a replenishing manner is preferably used. Various surfactants or organic solvents may be optionally added to the developing solution and the replenishing solution to accelerate or control developability, improve the dispersibility of development-scum, and/or improve the affinity of image portions on the printing plate with ink. Other agents commonly used in positive plate developers may also be included in the developer solution.

The composition is usually post-processed with water; optionally containing, for example, a surfactant. In the case of printing plates a desensitizing solution containing gum arabic or a starch derivative is used. Various combinations of these treatments can be used as the post-processing carried out when the imageable medium of the present embodiment is used in its different applications.

EXAMPLES

The invention is exemplified as follows:

| Substances | (Weight, %) |
|---|---|
| Substance (A), Polymer 3 or 4 | 55 |
| Substance (B), o-naphthaquinonediazide | 2 |
| Substance (C), ADS 830A (trademark) | 2 |
| Substance (D), 4-hexylresorcinol | 20 |
| Resole resin LB 9900 | 20 |
| N,N-Diethylaniline | 1 |

The substances of the composition are dissolved in MEK: Dowanol PM™ mixture, filtered and coated on the surface of anodized aluminum. After drying the resulting precursor has a dry coating weight of ~1.0-2.0 grams/m$^2$. The precursor may be imaged in a Creo Lotem 400 Quantum imaging device or a THEIMER MONTAKOP 135 print down frame. The exposed precursor is developed in ~5-10 wgt % potassium metasilicate solution in water for ~20-60 seconds, rinsed off with water and dried to produce the printing master.

Substance (B), substance (D) and N,N-Diethylaniline are available from:
Sigma-Aldrich Canada Ltd.
2149 Winston Park Dr,
Oakville,
Ontario,
L6H 6J8

ADS 830A (trademark) is available from:
American Dye Source,
Montreal,
QC,
Canada Resole resin LB 9900 is available from:
Bakelite Aktiengesellschaft
Iserlohn-Letmathe
Gennaer Str. 2-4
D-58642 Iserlohn There have thus been outlined the important features of the invention in order that it may be better understood, and in order that the present contribution to the art may be better appreciated. Those skilled in the art will appreciate that the conception on which this disclosure is based may readily be utilized as a basis for the design of other methods and apparatus for carrying out the several purposes of the invention. It is most important, therefore, that this disclosure be regarded as including such equivalent methods and apparatus as do not depart from the spirit and scope of the invention.

What is claimed is:

1. A radiation-sensitive composition comprising:
   a. at least one polyvinyl acetal comprising at least one acetal group, with at least one acetal group having a directly attached phenolic group and
   b. a radiation-sensitive substance that comprises at least one of:
      i. a quinonediazide group and
      ii. an onium salt,
      the composition further comnrising an infrared light-to-heat converting substance.

2. A radiation-sensitive composition comprising:
   a. at least one polyvinyl acetal comprising at least one acetal group, with at least one acetal group having a directly attached phenolic group and
   b. a radiation-sensitive substance that comprises at least one of:
      i. a quinonediazide group and
      ii. an onium salt,
      said composition further comprising a developability-enhancing substance.

3. The radiation-sensitive composition of claim 2, further comprising an aqueous-eluability retarding substance, or said at least one polyvinyl acetal is aqueous alkali-eluable and is present in an amount of from 40 to 95 weight %.

4. The composition of claim 1, wherein the polyvinyl acetal has the structure

—(CH$_2$—CH—CH$_2$—CH)$_b$—(CH$_2$—CH—CH$_2$—CH)$_c$—(CH$_2$—CH—CH$_2$—CH)$_d$—(CH$_2$—CH)$_e$—(CH$_2$—CH)$_f$—
       |       |              |       |              |       |              |              |
       O       O              O       O              O       O              O              OH
        \\   //                \\   //                \\   //               |
         CH                     CH                     CH                   C=O
         |                      |                      |                    |
         R$^1$                  R$^2$                  R$^3$                CH$_3$ and in which t=1 to 4, and where
  b=5 to 40 mole %, preferably 15 to 35 mole %
  c=10 to 60 mole %, preferably 20 to 40 mole %
  d=0 to 20 mole %, preferably 0 to 10 mole %
  e=2 to 20 mole %, preferably 1 to 10 mole %
  and f=5 to 50 mole %, preferably 15 to 40 mole %.

5. The radiation-sensitive composition of claim 1, wherein the radiation-sensitive substance is capable of rendering a gaseous phase upon heating.

6. The radiation-sensitive composition of claim 5, wherein the gaseous phase is produced by at least one of:
   a. the decomposition of the radiation-sensitive substance;
   b. the evaporation of the radiation-sensitive substance and
   c. a reaction of the radiation-sensitive substance with another moiety within the positive-working radiation-sensitive composition.

7. An imageable element comprising,
   a. a substrate and
   b. a coated and dried layer of the composition of claim 1 on a surface of the substrate.

8. An imageable element comprising,
   a. a substrate and
   b. a coated and dried layer of the composition of claim 2 on a surface of the substrate.

9. An imageable element comprising,
   a. a substrate and
   b. a coated and dried layer of the composition of claim 3 on a surface of the substrate.

10. An imageable element comprising,
    a. a substrate and
    b. a coated and dried layer of the composition of claim 4 on a surface of the substrate.

in which R$^1$ is —C$_n$H$_{2n+1}$ where n=1 to 12, and R$^2$ is

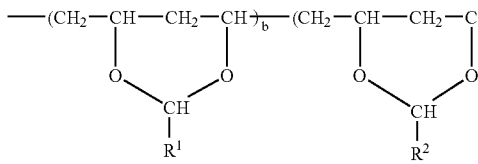

wherein
  R$^4$=—OH;
  R$^5$=—OH or —OCH$_3$ or Br— or —O—CH$_2$—C≡CH and
  B$^6$=Br— or NO$_2$
  R$^3$=—(CH$_2$)$_t$—COOH, —C≡CH, or

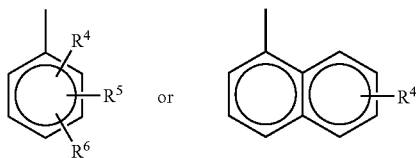

where R$^7$=COOH, —(CH$_2$)$_t$—COOH, —O—(CH$_2$)$_t$—COOH

11. An imageable element comprising,
    a. a substrate and
    b. a coated and dried layer of the composition of claim 5 on a surface of the substrate.

12. An imageable element comprising,
    a. a substrate and
    b. a coated and dried layer of the composition of claim 6 on a surface of the substrate.

13. A radiation-sensitive printing precursor comprising:
    a. a base, and
    b. a radiation-sensitive composition on a surface of the base, the composition comprising:
       iii. an acetal polymer substance comprising at least an acetal group with a directly attached phenolic group and
       iv. a radiation-sensitive substance that comprises at least one of:
          (1) a quinonediazide group and
          (2) an onium salt,
       the radiation-sensitive printing precursor further comprising an infrared light-to-heat converting substance.

14. The radiation-sensitive composition of claim 13, further comprising a developability-enhancing substance, or said at least one polyvinyl acetal is aqueous alkali-eluable and is present in an amount of from 40 to 95 weight %.

15. The radiation-sensitive composition of claim 14, further comprising an aqueous-eluability retarding substance.

16. The radiation-sensitive printing precursor of claim 13, wherein the acetal polymer has the structure

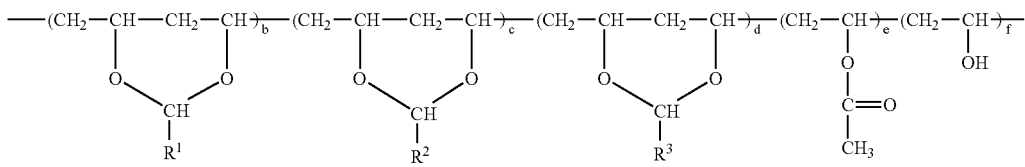

in which $R^1$ is —$C_nH_{2n+1}$ where n=1 to 12, and $R^2$ is

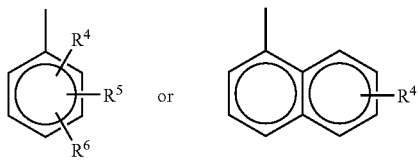

wherein
$R^4$=—OH;
$R^5$=—OH or —OCH$_3$ or Br— or —O—CH$_2$—C≡CH
and
$B^6$=Br— or NO$_2$
$R^3$=—(CH$_2$)$_t$—COOH, —C≡CH, or

where $R^7$=COOH, —(CH$_2$)$_t$—COOH, —O—(CH$_2$)$_t$—COOH
and in which t=1 to 4, and where b=5 to 40 mole %, preferably 15 to 35 mole %
c=10 to 60 mole %, preferably 20 to 40 mole %
d=0 to 20 mole %, preferably 0 to 10 mole %
e=2 to 20 mole %, preferably 1 to 10 mole
and f=5 to 50 mole %, preferably 15 to 40 mole %.

17. The radiation-sensitive printing precursor of claim 13 wherein the radiation-sensitive substance (B) is capable of rendering a gaseous phase upon heating.

18. The radiation-sensitive printing precursor of claim 17, wherein the gaseous phase is at least one of:
a. produced by the decomposition of the radiation-sensitive substance;
b. produced by the evaporation of the radiation-sensitive substance and
c. produced by a reaction of the radiation-sensitive substance and another moiety within the positive-working radiation-sensitive composition.

19. A method for making a radiation-sensitive precursor, the method comprising the steps of coating on a surface of a base a layer of a radiation-sensitive composition and drying the layer, wherein the composition comprises:
a. a polyvinyl acetal derived from polyvinyl alcohol by condensation with aldehydes and comprising at least an acetal group with a directly attached phenolic group and
b. a radiation-sensitive substance that comprises at least one of:
v. a quinonediazide group and
vi. an onium salt,
wherein the radiation-sensitive composition further comprises an infrared light-to-heat converting substance with a $\lambda_{max}$ within 10 nm of the wavelength of maximum output of the radiation source.

20. The radiation-sensitive composition of claim 19, further comprising a developability-enhancing substance.

21. The radiation-sensitive composition of claim 20, further comprising an aqueous-eluability retarding substance.

22. The method of claim 19, for making a radiation-sensitive precursor wherein the acetal polymer has the structure

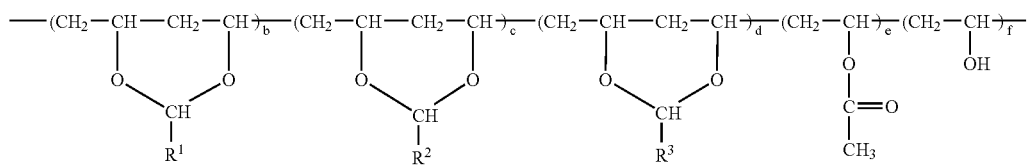

in which $R^1$ is —$C_nH_{2n+1}$ where n=1 to 12, and $R^2$ is wherein
$R^4$=—OH;
$R^5$=—OH or —OCH$_3$ or Br— or —O—CH$_2$—C≡CH
and $B^6$=Br— or $NO_2$
$R^3$=—$(CH_2)_t$—COOH, —C≡CH, or

where $R^7$=COOH, —$(CH_2)_t$—COOH, —O—$(CH_2)_t$—COOH
and in which t=1 to 4, and where
b=5 to 40 mole %, preferably 15 to 35 mole %
c=10 to 60 mole %, preferably 20 to 40 mole %
d=0 to 20 mole %, preferably 0 to 10 mole %
e=2 to 20 mole %, preferably 1 to 10 mole %
and f=5 to 50 mole %, preferably 15 to 40 mole %.

23. The method of claim 19, wherein the radiation-sensitive substance is capable of rendering a gaseous phase upon heating.

24. The method of claim 23, wherein the gaseous phase is at least one of:
a. produced by the decomposition of the radiation-sensitive substance;
b. produced by the evaporation of the radiation-sensitive substance and
c. produced by a reaction of the radiation-sensitive substance and another moiety within the positive-working radiation-sensitive composition.

25. A method for making a lithographic master, the method comprising the steps of:
a. providing a radiation-sensitive precursor, the precursor comprising
  vii. a lithographic base and
  viii. a coated and dried layer of a radiation-sensitive composition, the composition comprising
    (1) a polyvinyl acetal derived from polyvinyl alcohol by condensation with aldehydes and comprising at least an acetal group with a directly attached phenolic group and
    (2) a radiation-sensitive substance that comprises at least one of a quinonediazide group and an onium salt,
b. imagewise irradiating areas of the layer with imaging radiation to render the layer more eluable in an aqueous alkaline solution in the areas irradiated and
c. treating the resulting imaged precursor with alkaline aqueous solution to remove eluable parts of the radiation-sensitive coating, wherein the composition further comprises an infrared light-to-heat converting substance with a $\lambda_{max}$ within 10 nm of the wavelength of maximum output of the radiation source.

26. The method of claim 25, wherein the composition further comprises a developability-enhancing substance.

27. The method of claim 26, wherein the composition further comprising an aqueous-eluability retarding substance.

28. The method of claim 25, wherein the polyvinyl acetal has the structure

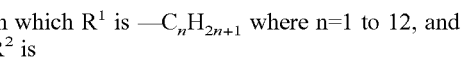

in which $R^1$ is —$C_nH_{2n+1}$ where n=1 to 12, and $R^2$ is

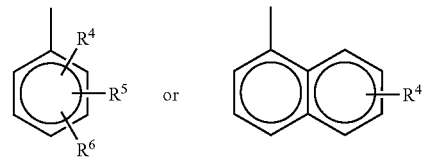

wherein
$R^4$=—OH;
$R^5$=—OH or —$OCH_3$ or Br— or —O—$CH_2$—C≡CH
and
$B^6$=Br— or $NO_2$
$R^3$=—$(CH_2)_t$—COOH, —C≡CH, or

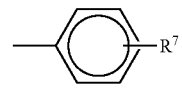

where $R^7$=COOH, —$(CH_2)_t$—COOH, —O—$(CH_2)_t$—COOH
and in which t=1 to 4, and where
b=5 to 40 mole %, preferably 15 to 35 mole %
c=10 to 60 mole %, preferably 20 to 40 mole %
d=0 to 20 mole %, preferably 0 to 10 mole %
e=2 to 20 mole %, preferably 1 to 10 mole %
and f=5 to 50 mole %, preferably 15 to 40 mole %.

29. The method of claim 25, wherein the radiation-sensitive substance is capable of rendering a gaseous phase upon heating.

30. The method of claim 29, wherein the gaseous phase is at least one of:
a. produced by the decomposition of the radiation-sensitive substance;
b. produced by the evaporation of the radiation-sensitive substance and
c. produced by a reaction of the radiation-sensitive substance and another moiety within the positive-working radiation-sensitive composition.

31. The method of claim 25 for making a lithographic master, the method comprising imagewise irradiating areas of the radiation-sensitive layer with ultraviolet imaging radiation to render the layer more eluable in an aqueous alkaline solution in the areas irradiated.

32. The method of claim 25, wherein the imagewise irradiation is performed using at least one of:
   a. ultraviolet imaging radiation to render the layer more eluable in an aqueous alkaline solution in the areas irradiated,
   b. infrared imaging radiation to render the layer more eluable in an aqueous alkaline solution in the irradiated areas and
   c, a combination of ultraviolet and infrared imaging radiation to render the layer more eluable in an aqueous alkaline solution in the irradiated areas.

\* \* \* \* \*

UNITED STATES PATENT AND TRADEMARK OFFICE
CERTIFICATE OF CORRECTION

PATENT NO. : 7,279,263 B2
APPLICATION NO. : 11/157204
DATED : October 9, 2007
INVENTOR(S) : Jonathan W. Goodin It is certified that error appears in the above-identified patent and that said Letters Patent is hereby corrected as shown below:

| | |
|---|---|
| Col. 19, claim 1, line 15 | In Claim 1, delete "comnrising" and insert -- comprising --, therefor. |
| Col. 19, claim 2, line 26 | In Claim 2, after "enhancing" insert -- substance and an infrared light-to-heat converting --. |
| Col. 20, claim 13, line 55 | In Claim 13, before "acetal" delete "an" and insert -- a polyvinyl --, therefor. |
| Col. 20, claim 13, line 55 | In Claim 13, after "polymer" delete "substance". |
| Col. 21, claim 16, line 5 | In Claim 16, before "acetal" insert -- polyvinyl --. |
| Col. 21, claim 16, line 5 | In Claim 16, after "acetal" delete "polymer". |
| Col. 21, claim 16, line 58 | In Claim 16, after "mole" insert -- % --. |
| Col. 22, claim 22, line 42 | In Claim 22, before "acetal" insert -- polyvinyl --. |
| Col. 22, claim 22, line 42 | In Claim 22, after "acetal" delete "polymer". |
| Col. 25, claim 32, line 3 | In Claim 32, delete "claim 25," and insert -- claim 25 --, therefor. |
| Col. 26, claim 32, line 4 | In Claim 32, delete "c," and insert -- c. --, therefor. |

Signed and Sealed this

Twenty Second Day of April, 2008

JON W. DUDAS
*Director of the United States Patent and Trademark Office*